United States Patent [19]

Nam

[11] Patent Number: 5,485,207
[45] Date of Patent: Jan. 16, 1996

[54] CCD IMAGE SENSOR FOR NORMAL AND MIRROR IMAGES

[75] Inventor: Jung H. Nam, Suwon, Rep. of Korea

[73] Assignee: Samsung Electronics Co., Ltd., Suwon, Rep. of Korea

[21] Appl. No.: 65,018

[22] Filed: May 24, 1993

[30] Foreign Application Priority Data

May 22, 1992 [KR] Rep. of Korea ............... 92-8682

[51] Int. Cl.$^6$ .................. H04N 5/335; H04N 3/14
[52] U.S. Cl. .................. 348/321; 348/303; 348/322; 257/240; 257/241; 437/53
[58] Field of Search .................. 348/298, 302, 348/317, 320, 321, 319, 311, 314; 437/53; 358/450; 250/208.1; 257/240, 241; H04N 5/335

[56] References Cited

U.S. PATENT DOCUMENTS 5,134,087  7/1992  Hynecek ................. 437/53
5,272,537  12/1993  Watanabe ................. 348/303

OTHER PUBLICATIONS

E. Koyama et al., "A Single-Output CCD Image Sensor For Normal and Mirror Images", ITEC '91, 1991, pp. 31–32.

Primary Examiner—Michael T. Razavi
Assistant Examiner—Andrew B. Christensen
Attorney, Agent, or Firm—Charles R. Donohoe; Stephen R. Whitt

[57] ABSTRACT

A single-output CCD image sensor selectively transfers a normal or a mirror image without changing the combination of clock signals needed by the HCCD. The CCD image sensor comprises VCCD's arrayed in each row, photodiodes connected to the VCCD's through transfer gates, and an upper HCCD connected to one end of the VCCD's. A rotating part for connecting one end of the upper and lower HCCD's as used for one of the normal or mirror image serial transfers. A control gate formed in parallel between the upper and the lower HCCD is used for the other of the normal or mirror image serial transfers, and operates in parallel. An output circuit is connected to the other end of the lower HCCD.

13 Claims, 3 Drawing Sheets

CCD IMAGE SENSOR FOR NORMAL AND MIRROR IMAGES

BACKGROUND OF THE INVENTION

1. Field of the Art

The present invention relates to CCD (Charge Coupled Device) image sensors and more particularly, to a CCD image sensor which selectively outputs either normal or mirror images.

2. Background of the Related Art

CCD's store charges in a silicon substrate above which is disposed an $SiO_2$ insulator layer. Above the insulator layer are disposed many fine adjacent electrodes. If one of the electrodes is biased to a higher voltage than the neighboring electrodes, a potential well that is capable of storing charges is formed in the silicon substrate below the selected electrode. If the voltage at this electrode is lowered and the voltage at one of the neighboring electrodes is raised, the corresponding neighboring potential well becomes deeper and the charges flow into the neighboring potential well. By repeating this operation, the charges are sequentially transferred from potential well to neighboring potential well by external signals applied to the electrodes.

Solid image sensors utilize CCD's and are categorized according to the construction of a light-receiving element, which element converts incident light charge, and the type of CCD transfer element. The primary types are: IT-CCD type and FT-CCD type. Variation also exist, such as the FIT-CCD type, which combines the IT-CCD and FT-CCD types.

Such image sensors are used in, for example, video tape recorder cameras. This requires miniaturization, high quality, and high functional features for the CCD image sensor. One of the most desired functions, especially to monitoring television cameras, is a mirror image, i.e., a left and right inverse image, primarily for monitoring from the back side.

FIG. 1 shows a structural diagram of a two-output IT-CCD image sensor capable of outputting normal and mirror images according to the known technology. The conventional CCD image sensor consists o photodiodes 13 for generating signal charges proportional to the intensity of an incident light, vertical transfer CCD's 11 (VCCD) for transferring he signal charges in a vertical direction, horizontal transfer CCD's 15 (HCCD) for transferring the signal charges in a horizontal direction and two output circuits 17 and 19. Transfer gates 12 couple the photodiodes to the VCCDs. Clock signals H1–H4 drive four unit gates of the HCCD 15.

In the prior-art CCD image sensor, the mirror image can be obtained by inverting the direction of the charge transfer of the HCCD 15. Thus, the normal image is output in the solid line direction, while the mirror image is output in the dotted line direction. In order to simultaneously obtain both normal and mirror images in the prior-art CCD image sensor, two output circuits 17 and 19 are required at each end of the HCCD 15.

A single-output CCD image sensor having both normal and mirror images has also been proposed (1991 ITE Annual Convention P. 31–32). FIG. 2 shows a structural diagram of such a single-output CCD image sensor. VCCD's 21 are arrayed in each row and photodiodes 23 are arrayed in the column direction and connected through the transfer gates to the VCCD's 21 in each row. A HCCD 25 is connected to one end of the VCCD's in each row and has upper and lower parts 25a and 25b, connected by a rotating element 25c. An output circuit 27 is connected to one end of the mixing element 25d, and the clock signals H1–H4 are applied to the four gates formed in the HCCD 25.

In the normal image transfer mode, the signals generated from the photodiodes arrayed in each column C1–C4 are transferred through the transfer gates 22 to the respective VCCD's 21 in each row R1–R4. After that, the signals of VCCD's 21 in the first row R1, one from each column, are transferred to the upper HCCD 25a. The signals of VCCD's 21 in the second row R2, one from each column, are transferred to the empty VCCD's 21 of the first row R1. Similarly, the signals of VCCD's 21 in the third row R3 are transferred to the empty VCCD's 21 in the second row R2 and the signals of VCCD's 21 in the fourth row R4 are then transferred to the third row R3. The signals from the first row, transferred to the upper HCCD 25a, are then transferred in the solid line direction using a first combination of clock signals H1–H4 and sequentially transferred to the output circuit 27 through the mixing element 25d. Thus, the output circuit 27 sequentially outputs the first column signal of the first row R1C1, the second column signal of the first row R1C2, the third column signal of the first row R1C3 and the fourth column signal of the first row R1C4. The signals from the second, the third, and fourth rows are then sequentially output in the same manner.

In the mirror image transfer mode, the signals generated from the photodiodes arrayed in each column C1–C4 are transferred through the transfer gates 22 to the respective VCCD's 21 in each row R1–R4. As in the normal transfer mode, the signals in the first row R1 of VCCD's 21 are transferred to the upper HCCD 25a and the signals in the respective second, third and fourth rows are transferred a single row down. However, the signals from the first row R1, that have been transferred to the upper HCCD 25a are then transferred in the dotted line direction by a second combination of clock signals H1–H4 and provided to the output circuit 27 via the rotating element 25c, the lower HCCD 25b and the mixing element 25d. Thus, the output circuit 27 sequentially outputs the fourth column signal of the first row R1C4, the third column signal of the first row R1C3, the second column signal of the first row R1C2 and the first column signal of the first row R1C1. The signals of the second, the third, and the fourth rows are then sequentially output in the same manner.

This particular prior-art single output CCD image sensor advantageously consumes smaller amounts of current due to the single output circuit and its peripheral circuits are simplified due to the simplified output. However, this particular CCD image sensor requires applying a very complex combination of the clock signals to the upper HCCD in order to change the transfer direction. Additional clock signals are also needed in the mixing element to prevent incorrect signal transfer. This complexity thus creates quality problems of its own.

SUMMARY OF THE INVENTION

The object of the present invention is to provide a CCD image sensor for transferring normal and mirror images sing the same combination of clock signals.

According to the present invention, VCCD's are arrayed in columns, and photodiodes are connected to the VCCD's through transfer gates. An upper HCCD is connected to one end of the VCCD's and a rotating element connects one end of the upper HCCD to the lower HCCD's. The rotating element is used to obtain mirror images. A control gate formed between the upper and the lower HCCD is used to transfer normal image signals from the upper to lower HCCD's. Both normal and mirror images are obtained using the same clock signals. A single output is connected to one end of the lower HCCD.

DETAILED DESCRIPTION OF THE INVENTION

Figure 1:
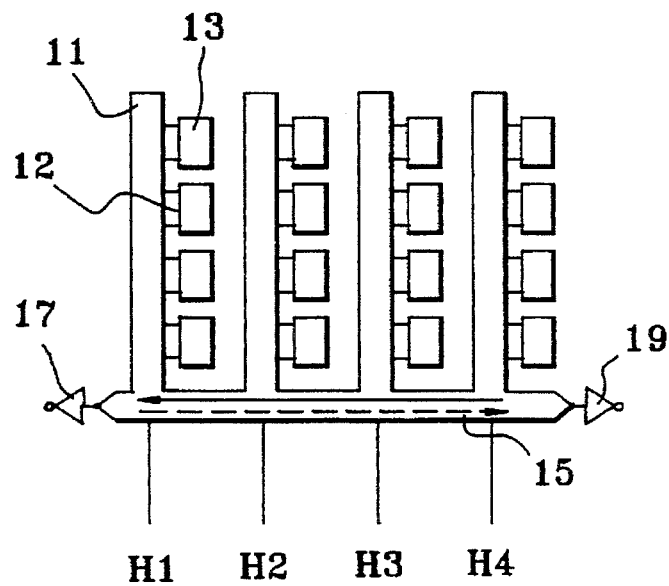
FIG. 1 is a structural diagram of a two-output CCD image sensor for normal and mirror images according to the conventional technology.
Figure 2:
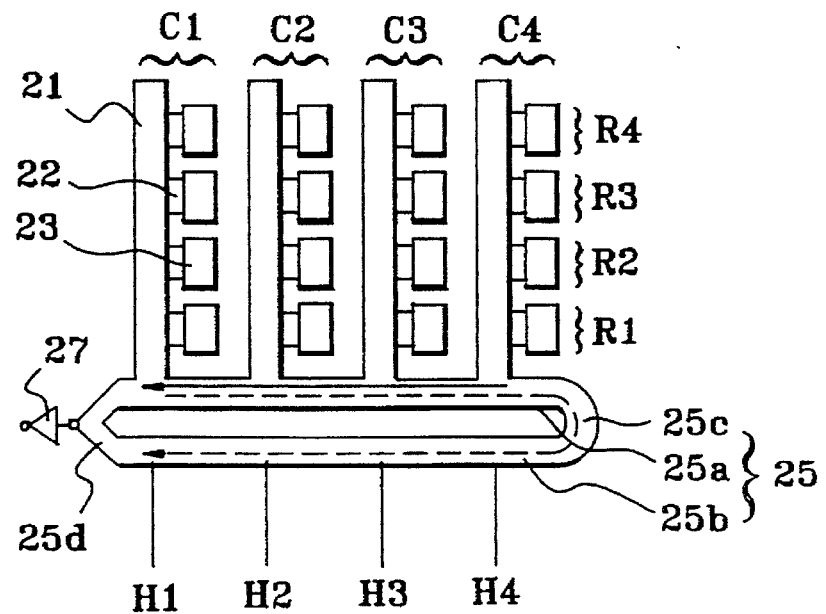
FIG. 2 is a structural diagram of a single-output CCD image sensor for normal and mirror images according to the conventional technology.
Figure 3:
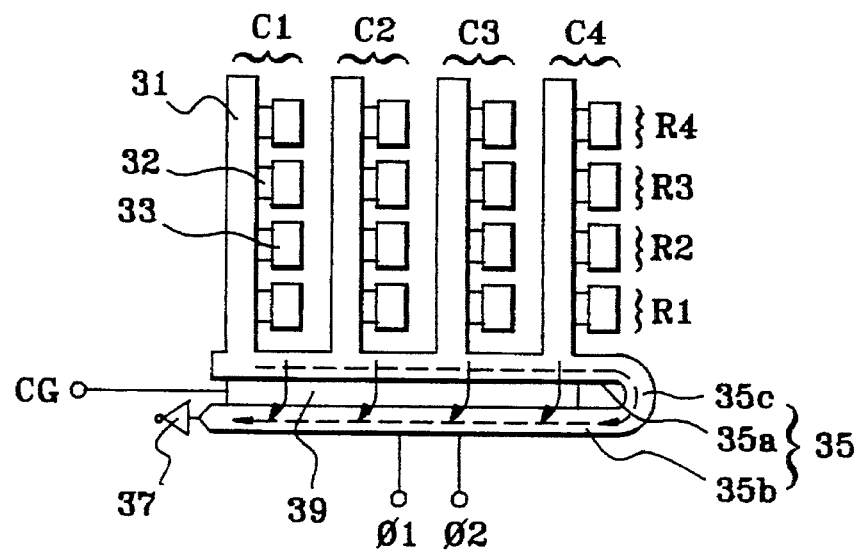
FIG. 3 is a structural diagram of an embodiment of a CCD image sensor for normal and mirror images according to the present invention.

FIG. 3 shows a structural diagram of an embodiment of a COD image sensor for normal and mirror images according to the present invention.

VCCD's 31 are positioned in each column and photodiodes 33 are arrayed in a column direction to the VCCD's 31 and connected to the VCCD's through transfer gates 32. HCCD 35 is composed of an upper HCCD 35a, a lower HCCD 35b and a rotating element 35c. The upper 35a is connected to one end of the VCCD's in each column. An output circuit 37 is connected to one end of the lower HCCD. Control gate 39 is formed between the upper and the lower HCCD's 35c 35b and is operated with a control signal as will be described further hereinafter. The HCCD 35 also uses two-phase clock signals $\phi 1$ and $\phi 2$.

In the normal image transfer mode, the signals generated at the photodiodes 33 associated with respective columns C1–C4 are transferred to the corresponding VCCD's 31 through a corresponding transfer gate 32. After that, the signals of VCCD's 31 in the first row R1, (one each from the first column C1, the second column C2, the third column C3 and the fourth column C4), are transferred to the upper HCCD 35a. The signals of VCCD's 31 in the second row R2, are transferred to the now empty VCCD's 31 in the first row R1. Similarly, the signals of VCCD's 31 in the third row R3 are transferred to the now empty VCCD's 31 in the second row R2. Likewise, the signals of VCCD's 31 in the fourth row R4 are transferred to the now empty VCCD's 31 third row R3. Once the signals from the first row are transferred to the upper HCCD 35a, a control signal of a predetermined level CG is applied to the control gate 39, and, for reasons explained hereinafter, the Signals on the upper HCCD 35a, originally from the first, second, third, and fourth columns C1–C4 of the first row R1, are thus transferred in parallel to the lower HCCD 35b through the control gate 39. The signals thus transferred in parallel to the lower HCCD 35b are then serially transferred to the output circuit 37 using the two-phase clock signals $\phi 1$ and $\phi 2$. The output circuit 37 then serially outputs the first column signal of the first row R1C1, the second column signal of the first row R1C2, the third column signal of the first row R1C3 and the fourth column signal of the first row R1C4. The signals from the second to the fourth rows are similarly and sequentially transferred to the upper HCCD 35a, then transferred in parallel to the lower HCCD 35b in response to a control signal CG and then serially transferred from the lower HCCD 35b to the output circuit 37. Thus, in the normal image transfer mode, the signals provided to the upper HCCD 35a are output in the solid line direction illustrated in FIG. 3.

In the mirror image transfer mode, the signals generated at the photodiodes 33 arrayed in the respective columns C1–C4 are transferred to the corresponding VCCD's 31 through the transfer gate 32 and transferred, row by row, into the upper HCCD 35a as in the normal signal transfer mode. However, during the mirror image signal transfer mode, control gate 39 does not receive the transfer control signal. Thus, signals in the upper HCCD 35a, transferred from the first to the fourth columns C1–C4 of the first row R1 and each respective row, successively, are rotated to appear at output 37 in the mirror image order via the rotating element 35c and the lower HCCD 35b in response to the two-phase clock signals. Thus, the output circuit 37 serially outputs the fourth column signal of the first row R1C4, the third column signal of the first row R1C3, the second column signal of the first row R1C2 and the first column signal of the first row R1C1. Similarly transferred are the signals from the second, third and fourth rows. In the mirror image transfer mode, therefore, the signals are transferred from the upper HCCD 35a to the lower HCCD 35b through the rotating element 35c in the dotted line direction illustrated in FIG. 3.

Figure 4:
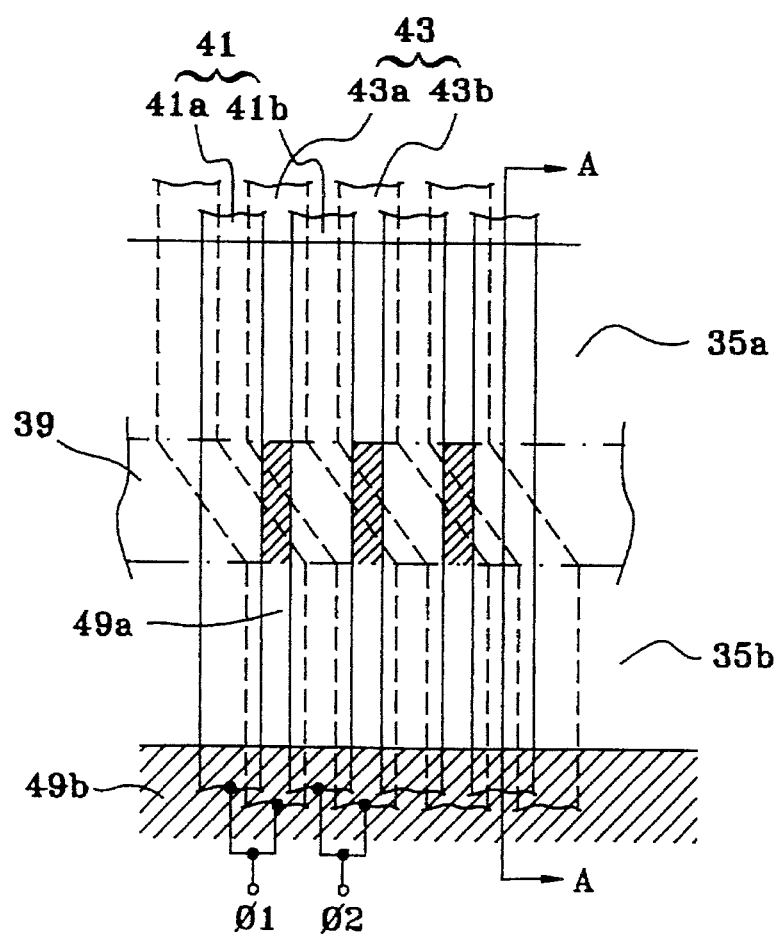
FIG. 4 is a plane view of a horizontal transfer gate located at a horizontal transfer CCD of an image sensor for normal and mirror images according to the present invention.

FIG. 4 snows a plane view of the horizontal transfer gate in the HCCD 35 of the image sensor according to the present invention. The control gate 39 is formed between the channel regions of the upper and the lower HCCD's 35a and 35b. The first horizontal transfer gates 41, spaced at a constant distance from each other, cross at right angles to the upper and the lower HCCD 35a and 35b and the control gate 39. The second horizontal transfer gates 43 are also spaced a constant distance from each other, cross at right angles to the upper and the lower HCCD 35a and 35b, but each have an angled position 60 at the control gate crossing. This angled position thus causes the adjacent second horizontal transfer gates 43 and first horizontal transfer gates 4 to be shifted in phase between the upper and the lower HCCD's 35a and 35b, respectively.

In operation, the first clock signal $\phi 1$ is applied to odd-numbered (even-numbered) first and second horizontal transfer gates 41a and 43a, while the second clock signal $\phi 2$ is applied to even-numbered (odd-numbered) first and the second horizontal transfer gates 41b and 43b. Channel stop regions 49a are formed in the semiconductor substrate between adjacent first horizontal transfer gates 41 in the control gate region. Channel top region 49b is formed at the outside edge of the lower HCCD 35b.

Figure 5:
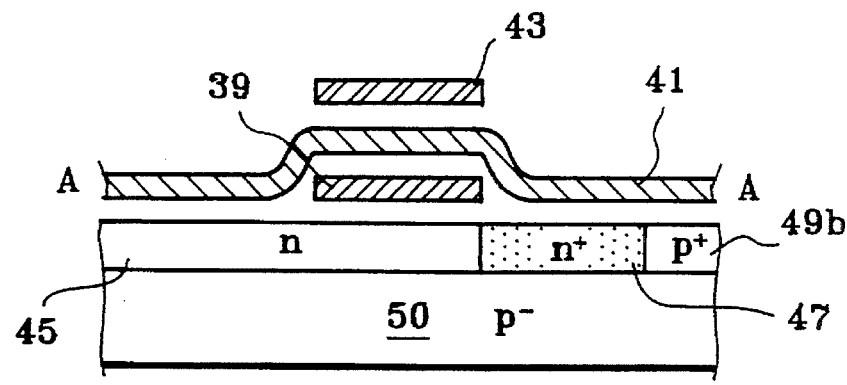
FIG. 5 s a cross-sectional view of FIG. 4 taken along line A—A.

FIG. 5 shows a cross-sectional view along line A—A of FIG. 4, which has a bulk channel structure. N—type region 45, n+type region 47 and p+type region 49b are formed at the surface of a p-type silicon substrate 50. The n+-type region 47 forms the channel of the lower HCCD 35b and p+type region 49b is the channel stop that prevents leakage of the signal transferred through the lower HCCD 35b. In the n-type region 45 and n+type region 47 adjacent to the second horizontal transfer gates 43, p-type impurities are doped so that its potential level becomes lower than the regions adjacent the first horizontal transfer gate 41. The control gate 39 is formed over the n-type region 45, which is separated from the p-type silicon substrate 50 by oxide. The first horizontal transfer gate 41 is isolated from the control gate 39 by an oxide layer and is formed on the upper and the lower HCCD 35a and 35b and the control gate 39. The second horizontal transfer gate 43 is isolated from the first horizontal transfer gate 41 by oxide and formed over both the control gate 39 and the first horizontal transfer gate 41 in the control gate zone.

Figure 6A:
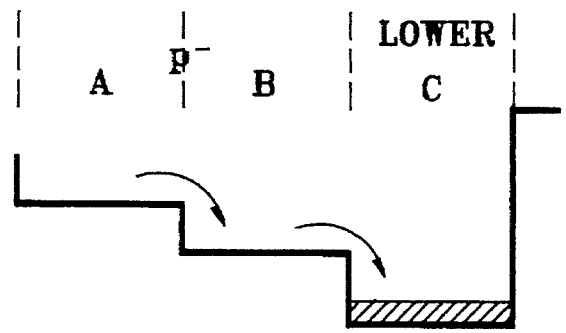
FIG. 6A and 6B are potential distribution diagrams of a CCD image sensor for normal and mirror images when charges are transferred by control gates.
Figure 6B:
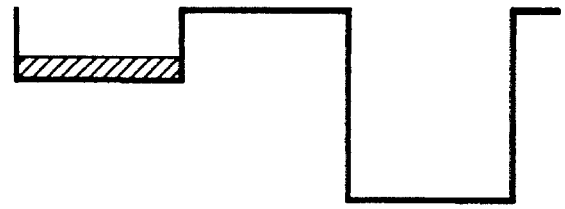

FIGS. 6A and 6B are potential distribution diagrams of the CCD image sensor for normal and mirror images according to the present invention.

Referring to FIG. 6A, if the control gate 39 enters the transfer state, control signal CG is applied. Therefore, the potential level at the channel region B formed below the control gate 39 becomes higher than that at the channel region A of the upper HCCD 35a but lower than that at the channel C of the lower HCCD 35b. The signals in the upper HCCD 35a are therefore transferred in parallel to the lower HCCD 35b through the channel formed below the control gate 39. The two-phase clock signals $\phi 1$ and $\phi 2$ then sequentially transfer these signals to the output circuit 37. Thus, the normal image is output.

If the control gate 39 does not receive control signal CG, the potential at the region B below the control gate 39 becomes lower than that at the channel region A of the upper HCCD 35a. Thus, the signals in the upper HCCD 35a cannot pass the region B and are not passed through control gate 39 to the lower HCCD 35b. Therefore, the signals of the upper HCCD 35a are sequentially transferred horizontally by the two-phase clock signals $\phi 1$ and $\phi 2$, to and through the rotating element 35c, and along lower HCCD 35b using the same two-phase clock signals 41 and 42 to the output circuit 37 and thereby providing the mirror image.

Figure 7:
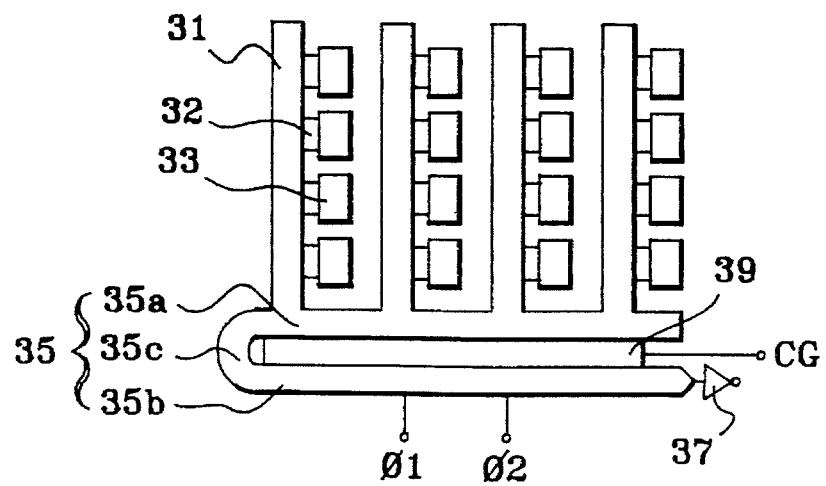
FIG. 7 is a structural diagram of another embodiment of a CCD image sensor for normal and mirror images according to the present invention.

FIG. 7 shows a structural diagram of another embodiment of a CCD image sensor for normal and mirror images according to the present invention. Designation used in FIG. 7 are the same as those in FIG. 6. The difference in this embodiment is that the normal image signals pass through the rotating element 35c and the mirror image signals pas directly through, in parallel, from the upper HC(D 35a to the lower HCCD 35b. Thus control signal CG is used to indicate a parallel transfer of mirror image signals whereas in the previous embodiment control signal CG indicated a parallel transfer of normal image signals.

As described hereinabove, the present invention forms a mirror image without changing the combination of the clock signals using the parallel transfer of signals from the upper HCCD to the lower HCCD through the control gate. Thus, the CCD image sensor according to the present invention is simpler in design because different combinations of clock signals are not necessary to change the direction of horizontal transfer of the signals. Thus, a solid state image sensor according to the present invention easily forms a mirror image for monitoring from the back side.

While the invention has been described in connection with what is presently considered to be the most practical and preferred embodiments, it is understood that the invention is not limited to the disclosed embodiment, but, on the contrary, is intended to cover various modifications and equivalent arrangements included within the spirit and scope of the appended claims.

What is claimed is:

1. A CCD image sensor for creating normal and mirror images, comprising:

a plurality of photodiodes arranged in a matrix of rows and columns, said photodiodes sensing incident light to obtain a plurality of image signals, one image signal from each photodiode;

a plurality of transfer gates, each transfer gate connected to one of said photodiodes for transferring one of said image signals;

a vertical transfer charge coupled device arranged in a plurality of columns adjacent to said columns of said photodiodes, said vertical transfer charge coupled device coupled to said photodiodes through said transfer gates, each of said vertical transfer charge coupled device columns sequentially transferring image signals from each row of photodiodes to a column end using clock signals;

an upper horizontal transfer charge coupled device connected to said column ends of each said vertical transfer charge coupled device columns, said upper horizontal transfer charge coupled device sequentially inputting each row of image signals from each row of photodiodes in row image order and subsequently serially transferring each of said rows of image signals in a first direction in an absence of a transfer signal to a horizontal row output and transfers said rows of image signals in a fourth direction perpendicular to said first direction in a presence of said transfer signal;

an output circuit connected to only one horizontal charge coupled device;

a lower horizontal transfer charge coupled device having a horizontal row input, said lower horizontal transfer charge coupled device inputting said image signals from each row and subsequently serially transferring each of said rows of image signals in a second direction as a lower horizontal charge output to said output circuit;

rotating means connected to said horizontal row output and said horizontal row input for transposing said row image order for each row of image signals serially transferred by said upper horizontal transfer charge coupled device to said lower horizontal transfer charge coupled device, said rotating means transferring each of said rows of image signals in a third direction;

transfer means connected between said upper horizontal transfer charge coupled device and said lower horizontal transfer charge coupled device for transferring each row of image signals from said upper horizontal transfer charge coupled device to said lower horizontal transfer charge coupled device in response to said presence of said transfer signal;

wherein said upper horizontal transfer charge coupled device and said lower horizontal transfer charge coupled device serially transfer said image signals using said clock signals, and wherein said row of image signals travel through said upper horizontal transfer charge coupled device, said lower horizontal transfer charge coupled device, and said rotating means respectively in said first, second and third directions when said CCD image sensor is creating one of a normal and a mirror image, and travel in said upper horizontal transfer charge coupled device in said fourth direction and in said lower horizontal transfer charge coupled device in said second direction when said CCD image sensor is creating the other of said normal and said mirror images.

2. A CCD image sensor according to claim 1, wherein said normal image is created when said rows of image signals are transferred through said transfer means and said mirror image is created when said rows of image signals are transferred through said rotating means.

3. A CCD image sensor according to claim 1, wherein said mirror image is created when said rows of image signals are transferred through said transfer means and said normal image is created when said rows of image signals are transferred through said rotating means.

4. A CCD image sensor for normal and mirror images according to claim 1, wherein said transfer means transfer said rows of image signals from said upper horizontal transfer charge coupled device to said lower horizontal transfer charge coupled device in parallel.

5. A CCD image sensor according to claim 1, wherein said upper horizontal transfer charge coupled device has an upper channel potential greater than a lower channel potential for a corresponding channel of said lower horizontal transfer charge coupled device.

6. A CCD image sensor according to claim 1, wherein said clock signals include $\phi 1$ and $\phi 2$ clock signals.

7. A CCD image sensor according to claim 1, wherein said upper horizontal transfer charge coupled device and said lower horizontal transfer charge coupled device share a plurality of spaced transfer gates.

8. A CCD image sensor according to claim 7, wherein said plurality of spaced transfer gates includes:

a first plurality of substantially linear first electrodes spaced a predetermined distance;

a second plurality of second electrodes spaced a second predetermined distance and insulated from said first plurality of electrodes, each of said second electrodes having first and second linear ends connected by an angled middle portion, each of said first and second linear ends having first and second side portions that overlap an adjacent first electrode; and wherein said transfer means includes a transfer gate that is electrically insulated from said first and second electrodes, disposed perpendicular to said substantially linear first electrodes and formed over said angled middle portion of said second electrodes.

9. An image sensor for creating normal and mirror images, comprising:

means for sensing incident light to obtain image signals arranged in a matrix containing a plurality of rows and columns;

means for vertically transferring said image signals by row, said vertical transfer means arranged in a plurality of columns, each column having a column output end;

means for transmitting said image signals from said sensing means to said vertical transfer means;

upper horizontal transfer means connected to each of said column outputs for horizontally transferring said row of image signals in a first direction and for transferring said row of image signals in a fourth direction perpendicular to said first direction;

an output circuit;

lower horizontal transfer means for horizontally transferring said row of image signals in a second direction to said output circuit;

transposing means for transposing the order of said image signals in said row connected between said upper horizontal transfer means and said lower horizontal transfer means, operating in serial upon each row of said image signals to move said image signals in a third direction in said transposing means; and means for transferring in parallel said row of image signals in a same order from said upper horizontal transfer means to said lower horizontal transfer means;

wherein said row of image signals travel through said upper horizontal transfer means, said lower horizontal transfer means, and said transposing means respectively in said first, second and third directions when said CCD image sensor is creating one of a normal and a mirror image, and travel in said upper horizontal transfer means in said fourth direction and in said lower horizontal transfer means in said second direction when said CCD image sensor is creating the other of said normal and mirror image.

10. An image sensor according to claim 9, wherein said means for transferring operates in response to a transfer signal.

11. An image sensor according to claim 10, wherein said means for transposing operates in an absence of said transfer signal.

12. An image sensor according to claim 9, wherein said means for transferring operates to provide normal image signals and said means for transposing operates to provide mirror image signals.

13. An image sensor according to claim 9, wherein said means for transferring operates to provide mirror image signals and said means for transposing operates to provide normal image signals.

* * * * *